United States Patent [19]

Yu

[11] Patent Number: 4,850,882

[45] Date of Patent: Jul. 25, 1989

[54] ROTATABLY MOUNTED PRINTED CIRCUIT BOARD TEST SUPPORT AND CONNECTOR

[76] Inventor: Wenli Yu, 20230 Lea Pond Pl., Gaithersburg, Md. 20879

[21] Appl. No.: 138,832

[22] Filed: Dec. 28, 1987

[51] Int. Cl.$^4$ ............................................. H01R 39/02
[52] U.S. Cl. ........................................ 439/31; 439/24; 439/59
[58] Field of Search ...................... 439/11, 13, 18, 20, 439/21, 23–26, 28, 31, 59

[56] References Cited

U.S. PATENT DOCUMENTS

| | | | |
|---|---|---|---|
| 3,425,021 | 1/1969 | Fow et al. | 439/59 |
| 4,715,819 | 12/1987 | Iwasa et al. | 439/31 |

FOREIGN PATENT DOCUMENTS 241580  7/1965  Austria .................................. 439/31

Primary Examiner—Eugene F. Desmond
Attorney, Agent, or Firm—Leon Gilden

[57] ABSTRACT

The instant invention includes a two-portion printed circuit board support stand and connector wherein an elongate rotatable first portion accommodates a printed circuit board therewithin. A second stationary portion is electrically associatable with a device accommodating a printed circuit board. The printed circuit board extends beyond an accommodating port of the rotatable first portion and is pivotal to enable testing of the printed circuit board and the like as the first portion is pivoted throughout an arcuate path presenting both sides of the printed circuit board extending beyond the first portion's accommodating part.

3 Claims, 2 Drawing Sheets

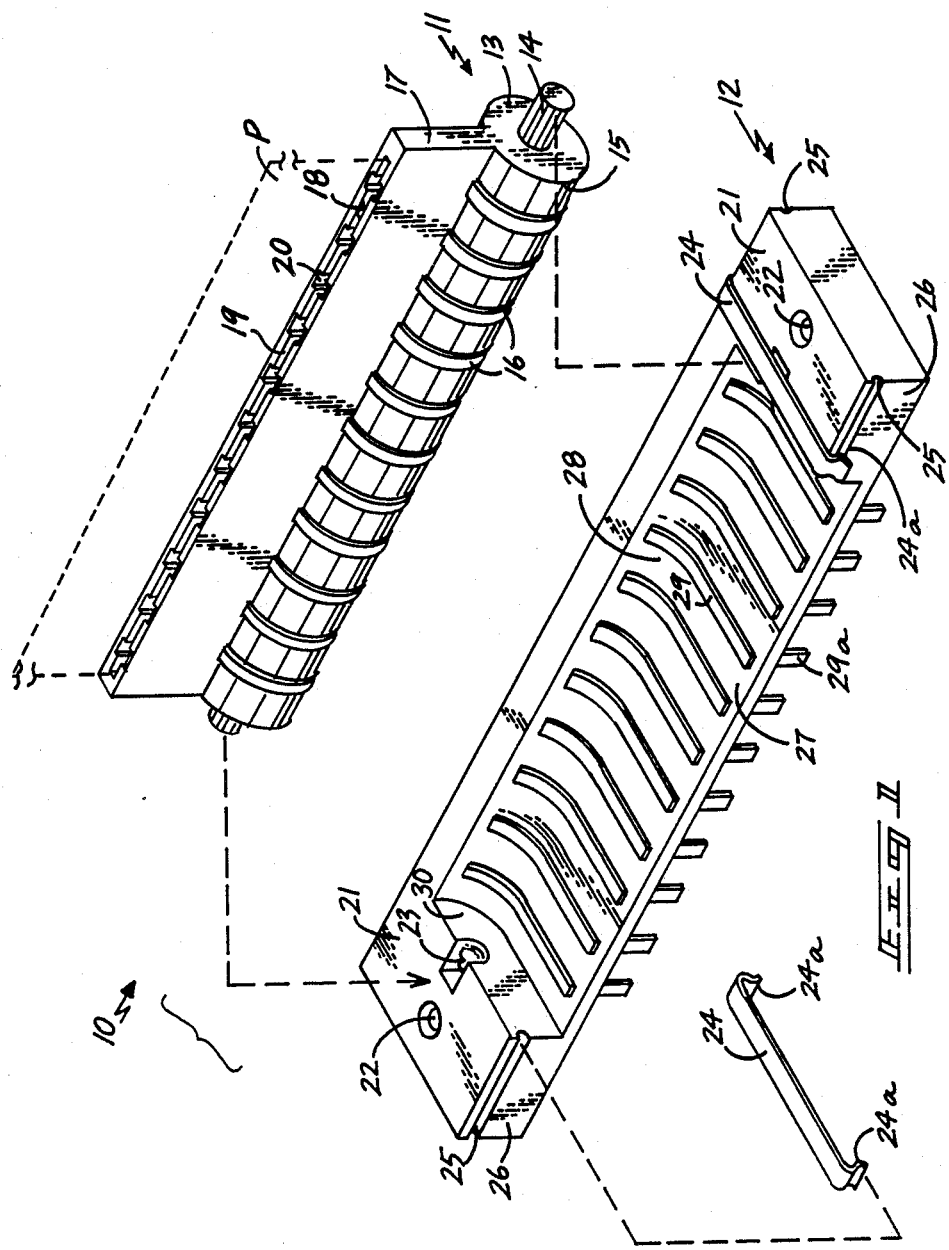

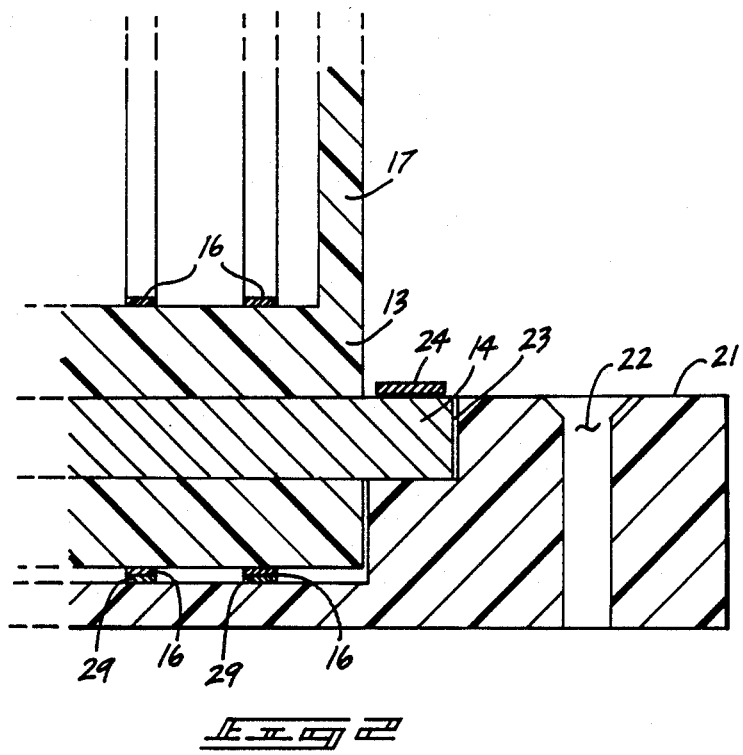
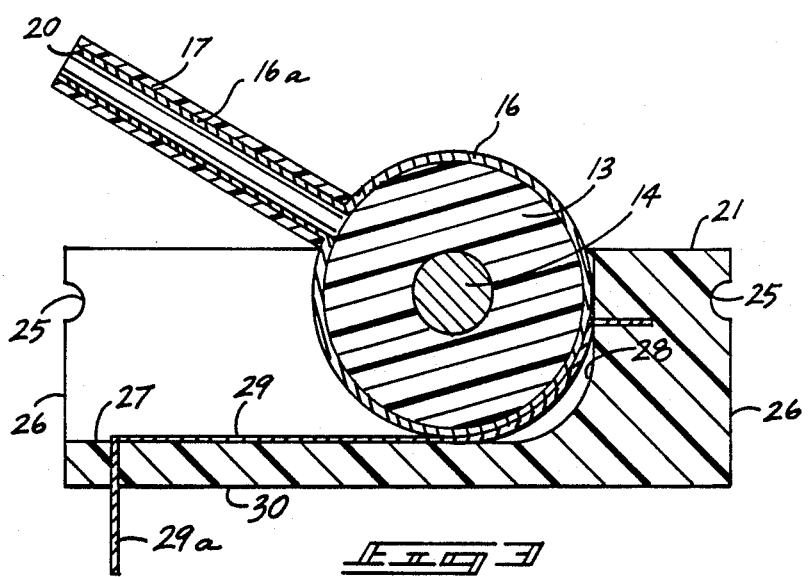

ROTATABLY MOUNTED PRINTED CIRCUIT BOARD TEST SUPPORT AND CONNECTOR

BACKGROUND OF THE INVENTION

1. Field of the Invention

The present invention relates to supports and connector apparatus for printed circuit boards and particularly pertains to a new and improved printed circuit board support and connector rotatably mounted presenting and connecting of said printed circuit board for testing and the like.

2. Description of the Prior Art

The use of printed circuit board connection apparatus is well known in the prior art. As may be appreciated, these devices have normally required an associated printed circuit board to maintain a pre-determined orientation relative to such apparatus. It is understood therefore that is desirable during the use of such printed circuit boards to test for defects therein while the printed circuit board is in electrical communication with an associated apparatus. Furthermore, the ease of access and replacement of a rotatably mounted printed circuit board is of enhanced use in the application to computers, control devices, communications equipment, and the like.

Electrical connectors of the past have attempted to accommodate the use of various printed circuit board holders various connectors. For example, U.S. Pat. No. 3,985,413 to Evans illustrates the use of a cylindrical connector formed with an extension. The device of Evans is presented for use between parallel substrates enabling compression of the connector to maintain alignment of conductors on the circuit. The patent is of interest only in its general configuration but is relatively remote in application and structure to the instant invention.

U.S. Pat. No. 3,728,662 to Puri sets forth a mechanism for enabling extension and retraction of various circuit boards wherein a plurality of holders enables reciprocating or telescoping association of the circuit board to a card cage. The Puri patent is of interest to a movably mounted printed circuit board support but lacks the flexibility and application of the instant invention.

U.S. Pat. No. 4,155,109 to Finch, et al. sets forth a means for providing electrical interconnection between a plurality of circuit boards. The cumbersome structure is relatively remote from the instant invention and is of proximate interest only in that the entire housing may be pivotally mounted but lacks any rotatable interconnection between the various printed circuit boards to a support structure, as does the instant invention.

U.S. Pat. No. 4,268,100 to Kekas, et al. sets forth a printed circuit board holder wherein a plurality of circuit boards may be pivoted through a 90 degree arc. The printed circuit boards are completely enclosed within the pivotal housing and fails to provide means for electrically associating a rotatably mounted printed circuit board holder to a companion support and electrically interconnecting the two by means of strip connectors.

U.S. Pat. No. 4,412,712 to Reimer, et al. sets forth a basic positioning arrangement for accommodating a multiple of circuit boards. The apparatus maintains the circuit boards in a spaced parallel relationship while permitting movement of one board relative to another, unlike the instant invention.

U.S. Pat. No 4,421,370 to Treakle, et al. provides for a compressible contact member formed of a plurality of cylindrically compressible portions to maintain electrical association between a plurality of spaced circuit boards.

As such, it may be appreciated that there is a continuing need for a new and improved printed circuit board support and connector apparatus which addresses both the problem of flexibility in application and compactness of structure and in this respect, the present invention substantially fulfills this need.

SUMMARY OF THE INVENTION

In view of the foregoing disadvantages inherent in the known types of printed circuit board connection devices now present in the prior art, the present invention provides a rotatably mounted printed circuit board support and connector to rotatably accommodate a printed circuit board and orient same in a plurality of arcuate positions relative to a support base to maintain electronic association with various devices. As such, the general purpose of the present invention, which will be described subsequently in greater detail, is to provide a new and improved rotatably mounted printed circuit board test support and connector which has all the advantages of the prior art printed circuit board connectors and none of the disadvantages.

To attain this, the present invention comprises a rotatably mountable printed circuit board accommodating first portion including an accommodating printed circuit board flange including a port of a height enabling an insertable printed circuit board to extend beyond the height of the flange of the rotatable portion. A plurality of circular strip connectors are engageable with companion strip connectors positioned on a stationary base portion including locking elements to rotatably secure the rotatable portion to the base portion and enable the rotatable portion to electronically associate with other components associatable electronically with said printed circuit base portion.

My invention resides not in any one of these features per se, but rather in the particular combination of all of them herein disclosed and claimed and it is distinguished from the prior art in this particular combination of all of its structures for the functions specified.

There has thus been outlined, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto. Those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

It is therefore an object of the present invention to provide a new and improved rotatably mounted printed circuit board test support and connector which has all the advantages of the prior art printed circuit board connectors and none of the disadvantages.

It is another object of the present invention to provide a new and improved rotatably mounted printed circuit board test support and connector which may be easily and efficiently manufactured and marketed.

It is a further object of the present invention to provide a new and improved rotatably mounted printed circuit board test support and connector which is of a durable and reliable construction.

An even further object of the present invention is to provide a new and improved rotatably mounted printed board test support and connector which is susceptible of a low cost of manufacture with regard to both materials and labor, and which accordingly is then susceptible of low prices of sale to the consuming public, thereby making such printed circuit board connectors economically available to the buying public.

Still yet another object of the present invention is to provide a new and improved rotatably mounted printed circuit board test support and connector which provides in the apparatuses and methods of the prior art some of the advantages thereof, while simultaneously overcoming some of the disadvantages normally associated therewith.

Still another object of the present invention is to provide a new and improved rotatably mounted printed circuit board test support and connector wherein a printed circuit board is accommodated in a slot in a rotatably mounted printed circuit board holder which is electrically associatable with a stationary support base thereby enabling arcuate positioning of said printed circuit board as desired for testing or spatial accommodation.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 1 is an exploded isometric view illustrating the various components, their configuration and relationship.

FIG. 2 is an orthographic cross-sectional view illustrating the assembled invention taken along the rotatable axial center line of the rotatable portion.

FIG. 3 is an orthographic view taken in elevation of the assembled invention taken in a plane perpendicular to the rotatable axial center of the rotatable portion.

DESCRIPTION OF THE PREFERRED EMBODIMENT

With reference now to the drawings, and in particular to FIG. 1 thereof, a new and improved rotatably mounted printed circuit board support and connector embodying the principles and concepts of the present invention and generally designated by the reference numeral 10 will be described.

More specifically it will be noted that the rotatably mounted printed circuit board test support and connector 10 is arranged for the accommodation of the conventionally known use of edge connector-type printed circuit boards referenced by the letter "P" in FIG. 1. The connector 10 is formed with a rotatable first portion 11 and a second stationary mountable portion 12.

FIG. 1 illustrates an electrically non-conductive support cylinder 13 formed within an axle 14 positioned medially through its axial center. The support cylinder 13 is formed with a cylindrical surface 15 with circular electrically conductive strip connectors 16 positioned at pre-determined spacings to conform to the spacing of an associated printed circuit board's edge connector spacings and accordingly may be subject to dimensional repositioning about surface 15. Circular strip connectors 16 extend internally of support flange 17, as illustrated in FIG. 3. The support flange 17 is orthogonally oriented relative to support cylinder 13 and is formed with an elongate opening 18 of a typical cross-sectional rectangular configuration. Planar walls 19 define a dimension within support flange 17 to slidingly accommodate the thickness of an associated printed circuit board positionable therein. Recessed walls 20 within opening 18 are spaced in a like manner to accept strip connectors 16 extensions indicated as elongate strip connectors extensions 16a therein providing electrical connection to edge connectors of a printed circuit board. It should be noted that the height of support flange 17 need only be that to accommodate the edge connector portions of an associated printed circuit board.

Mounting rotatable first portion 11 for rotation therein is stationary second portion 12 formed of a generally elongate configuration of electrically non-conductive material and of a length to accommodate the linear length of first portion 11. At terminal end sections of second portion 12 are mounting holes 22 formed dependingly from upper surface 21. Formed somewhat medially of second portion 11 is an elongate generally "L" shaped recess formed with a planar surface 27 with a generally arcuate transition surface 28 to a relatively vertical surface to accommodate rotatable first portion 11 therein. The "L" shaped recess is defined with respect to its linear extent by vertical surfaces 30 depending downwardly from surface 21 formed with mounting recesses 23 therein depending vertically downwardly from upper surface 21. Spring latch clips 24 are securable over said mounting recesses 23 to thereby capture axle 14 positionable therein and accordingly rotatable first portion 11 to second portion 12. The spring latch clips 24 are formed with protuberances 24a and are of a relatively resilient character to snap resiliently into accommodating latch grooves 25 formed within vertical surfaces 26. Electrically conductive strip connectors 29 are formed along the "L" shaped recess to complementarily associate with circular strip connectors 16 formed on rotatable first portion 11. Downwardly depending strip connector projections 29a depend downwardly through planar floor 27 to enable electrical connection to associated electrical apparatus. Sufficient length of projection 29a extends outwardly of base surface 30 to enable connection to associated equipment.

Once assembled the apparatus 10 accommodates a printed circuit board and its edge connectors within support flange 17 and accordingly may be rotated as desired and present both surfaces of the printed circuit board "P" for testing or for spatial repositioning, as desired.

As to the manner of usage and operation of the present invention, the same should be apparent from the above description. Accordingly, no further discussion relative to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be emcompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as being new and desired to be protected by LETTERS PATENT of the United States is as follows:

1. A printed circuit board support connector for acceptance of printed circuit boards formed with edge connectors wherein said connector comprises, a first portion means including an elongate generally cylindrical body of a first length provided with an axle, said axle defining a second length exceeding said first length and extending outwardly of each terminal end of said cylinder, and support flange means integrally secured to said cylindrical body defining a housing means for accepting a printed board therein, and a plurality of electrically circumferential connectors secured to said cylindrical body circumferentially thereof and oriented parallel to one another on said cylindrical body, and said cylindrical connectors extending around said cylindrical body and into said housing means for contact with said printed circuit board, and a second portion including a support means for rotatably accepting said first portion, and said support means including axle recess means for accepting said axle extending outwardly of each of said cylindrical terminal ends, and further including a recess within said support means positioned between said axle recess means, and a plurality of elongate connector strip means secured to said second portion within said recess and positioned for continuous contact with said circumferential connectors during rotation of said first portion relative to said second portions, and wherein said housing further defines an elongate recess including parallel side walls wherein said parallel side walls are formed with pairs of parallel recessed walls for accepting circumferential connector extensions extending therein integral with said circumferential connectors, and wherein said support flange housing means is of a length substantially equal said first length and is of a height substantially less than that of an associated printed circuit board insertable therein, and wherein said recess includes a generally "L" shaped recess for support of said first portion on either side of said "L" shaped recess, and wherein said "L" shaped recess includes said connector strip means, and wherein said connector strip means are each of a generally "S" shaped configuration with a first leg extending through a surface of said "L" shaped recess exteriorly of said second portion, and wherein the remainder of each of the "S" shaped connector strip means are positioned on a surface defined by said "L" shaped recess, and wherein spring latch clips are securable to said second portion overlying each end of said axle for securement of said axle.

2. A printed circuit board support connector as set forth in claim 1 wherein the circumferential connectors and said connector strip means are of equal number.

3. A printed circuit board support connector as set forth in claim 2 wherein said connector strip means are oriented in said "L" shaped recess substantially tangential to said cylindrical body.

* * * * *